(12) United States Patent
Takahashi

(10) Patent No.: US 12,149,161 B2
(45) Date of Patent: Nov. 19, 2024

(54) POWER CONVERSION DEVICE

(71) Applicant: Mitsubishi Electric Corporation, Tokyo (JP)

(72) Inventor: Yuya Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 236 days.

(21) Appl. No.: 17/790,305

(22) PCT Filed: Feb. 7, 2020

(86) PCT No.: PCT/JP2020/004744
§ 371 (c)(1),
(2) Date: Jun. 30, 2022

(87) PCT Pub. No.: WO2021/157048
PCT Pub. Date: Aug. 12, 2021

(65) Prior Publication Data
US 2023/0040345 A1    Feb. 9, 2023

(51) Int. Cl.
*H02M 1/088*   (2006.01)
*H03K 17/12*   (2006.01)
(Continued)

(52) U.S. Cl.
CPC .... *H02M 1/088* (2013.01); *H03K 2017/0806* (2013.01); *H03K 17/122* (2013.01); *H03K 17/145* (2013.01); *H03K 17/284* (2013.01)

(58) Field of Classification Search
CPC ... H02M 1/088; H03K 17/122; H03K 17/145; H03K 17/284; H03K 2017/0806
See application file for complete search history.

(56) References Cited

U.S. PATENT DOCUMENTS

2012/0280728 A1    11/2012   Hussein et al.
2012/0307540 A1*   12/2012   Tagome ............... H02M 1/088
                                                         363/131
(Continued)

FOREIGN PATENT DOCUMENTS

JP   2005-261035 A   9/2005
JP   2012-249509 A   12/2012
(Continued)

OTHER PUBLICATIONS

International Search Report for PCT/JP2020/004744 dated Apr. 28, 2020 [PCT/ISA/210].
(Continued)

*Primary Examiner* — Jue Zhang
(74) *Attorney, Agent, or Firm* — Sughrue Mion, PLLC; Richard C. Turner

(57) ABSTRACT

Provided is a control unit of a power conversion device configured to select, in each first set cycle, a first target switching element and a second target switching element from a plurality of switching elements connected in parallel to each other. The control unit performs control so that, at a time of a turn-on operation of a switching circuit, a turn-on start time of the first target switching element is earlier by a first set time period than a turn-on start time of another switching element that is not the first target switching element. The control unit performs control so that, at a time of a turn-off operation of the switching circuit, a turn-off start time of the second target switching element is later by a second set time period than a turn-off start time of another switching element that is not the second target switching element.

9 Claims, 12 Drawing Sheets

(51) Int. Cl.
  *H03K 17/14*    (2006.01)
  *H03K 17/284*   (2006.01)
  *H03K 17/08*    (2006.01)

(56)             References Cited

U.S. PATENT DOCUMENTS

2013/0257177 A1    10/2013  Jacobson et al.
2016/0218621 A1*    7/2016  Hayashi ................ H02M 1/088

FOREIGN PATENT DOCUMENTS

JP      2018-082587  A    5/2018
JP       2019-24312  A    2/2019
JP      2019-029457  A    2/2019
WO      2004/006037  A2   1/2004
WO      2011/096232  A1   8/2011
WO      2018/225436  A1  12/2018

OTHER PUBLICATIONS

Notification of reasons for refusal dated Oct. 18, 2022 from the Japanese Patent Office in Japanese Application No. 2021-575547.
Supplementary European Search Report issued Dec. 23, 2022 in European Application No. 20917364.0.

* cited by examiner

POWER CONVERSION DEVICE

CROSS REFERENCE TO RELATED APPLICATIONS

This application is a National Stage of International Application No. PCT/JP2020/004744, filed on Feb. 7, 2020.

TECHNICAL FIELD

This disclosure relates to a power conversion device including a switching circuit including a plurality of switching elements.

BACKGROUND ART

A general power conversion device includes a switching circuit including a plurality of switching elements. A capacity of the power conversion device can be increased by connecting the power conversion device itself in parallel or connecting the switching elements in parallel to each other. When the switching circuit is formed by connecting the plurality of switching elements in parallel to each other, the power conversion device can be downsized as compared to the case in which the power conversion device itself is connected in parallel. Further, in the power conversion device, simultaneously with downsizing, reduction of power loss is required.

In Patent Literature 1, there is described a technology in which, in a current path of each of the plurality of switching elements connected in parallel to each other, a sum of a self-inductance and a mutual inductance is set so as to be equal so that currents flowing through the respective switching elements are equalized.

Further, in Patent Literature 2, there is described a technology in which, in the plurality of switching elements connected in parallel to each other, gate resistances of the respective switching elements are set to have different values so that the currents flowing through the respective switching elements are equalized.

In Patent Literature 2, in a case of a switching element having a large inductance in the current path, the gate resistance is set to be small, and in a case of a switching element having a small inductance in the current path, the gate resistance is set to be large. Switching speeds of the respective switching elements have different values depending on the gate resistance values of the respective switching elements.

Further, in Patent Literature 3, there is described a technology in which, in the plurality of switching elements connected in parallel to each other, switching losses of the respective switching elements are equalized based on a switching characteristic of each switching element measured in advance.

In Patent Literature 3, the switching characteristic of each switching element, specifically, a switching speed di/dt obtained by using a gate voltage value and a slope of the gate voltage value as parameters is measured in advance. When each switching element is actually operated, the voltage value and the slope of the voltage value of each switching element are controlled in a variable manner based on the switching characteristic measured in advance, and thus the switching losses of the respective switching elements are equalized.

CITATION LIST

Patent Literature

[PTL 1] JP 2019-29457 A
[PTL 2] JP 2005-261035 A
[PTL 3] JP 2018-82587 A

SUMMARY OF INVENTION

Technical Problem

In Patent Literatures 1 and 2, when the currents flowing through the respective switching elements are equalized, conduction losses of the respective switching elements are equalized. As a result, it is expected that the maximum value of the conduction losses in the plurality of switching elements is reduced.

However, in Patent Literature 1, no consideration is given to variations in various characteristics such as threshold voltages and gate voltages of the plurality of switching elements. Accordingly, a switching loss of a specific switching element may be especially increased as compared to a switching loss of another switching element. Accordingly, in Patent Literature 1, the "maximum switching loss" in the plurality of switching elements, that is, the maximum value of the switching losses in the plurality of switching elements cannot be reduced.

Further, in Patent Literature 2, when the gate resistance value of the switching element is set to be large, the switching speed is decreased in accordance therewith. As a result, the switching loss is increased. Further, similarly to Patent Literature 1, no consideration is given to variations in the various characteristics such as the threshold voltages and the gate voltages of the plurality of switching elements. Accordingly, even in Patent Literature 2, the "maximum switching loss" in the plurality of switching elements cannot be reduced.

Further, in Patent Literature 3, it is expected that, when the switching losses of the plurality of switching elements are equalized, the "maximum switching loss" in the plurality of switching elements is reduced. However, in Patent Literature 3, the switching characteristic of each switching element is required to be measured in advance, which results in greatly increasing the number of manufacturing steps. Further, in Patent Literature 3, an additional component for controlling the gate voltage value and the slope of the gate voltage value in a variable manner is required, which results in greatly increasing the manufacturing cost.

This disclosure has been made to solve the above-mentioned problems, and has an object to provide a power conversion device with which, even when there are variations in various characteristics of a plurality of switching elements connected in parallel to each other, the maximum switching loss in the plurality of switching elements can be reduced without increasing the number of manufacturing steps and the manufacturing cost.

Solution to Problem

In order to solve the above-mentioned problems, according to this disclosure, there is provided a power conversion device, including: a switching circuit including M switching elements connected in parallel to each other, where M is an integer of 2 or more; and a control unit configured to control the switching circuit by controlling each of switching operations of the M switching elements, wherein the control unit is configured to: select, in each first set cycle corresponding to an integer multiple of a switching cycle of the switching circuit, where the integer is 1 or more, a first target switching element and a second target switching element from the M switching elements, the number of first target switching elements being 1 or more and less than M, the number of second target switching elements being 1 or more and less than M; perform control so that, at a time of a turn-on operation of the switching circuit, a turn-on start time of the first target switching element is earlier by a first set time period than a turn-on start time of another switching element that is not the first target switching element, the first set time period being set so as to be equal to or longer than a turn-on time period in a turn-on operation of the first target switching element; and perform control so that, at a time of a turn-off operation of the switching circuit, a turn-off start time of the second target switching element is later by a second set time period than a turn-off start time of another switching element that is not the second target switching element, the second set time period being set so as to be equal to or longer than a turn-off time period in a turn-off operation of the another switching element that is not the second target switching element.

Advantageous Effect of Invention

According to the power conversion device of this disclosure, even when there are variations in the various characteristics of the plurality of switching elements connected in parallel to each other, the maximum switching loss in the plurality of switching elements can be reduced without increasing the number of manufacturing steps and the manufacturing cost.

DESCRIPTION OF EMBODIMENTS

Now, details of embodiments of this disclosure are described with reference to the accompanying drawings. It should be noted, however, that the embodiments described below are merely an example, and this disclosure is not limited to the embodiments.

First Embodiment

Figure 1:
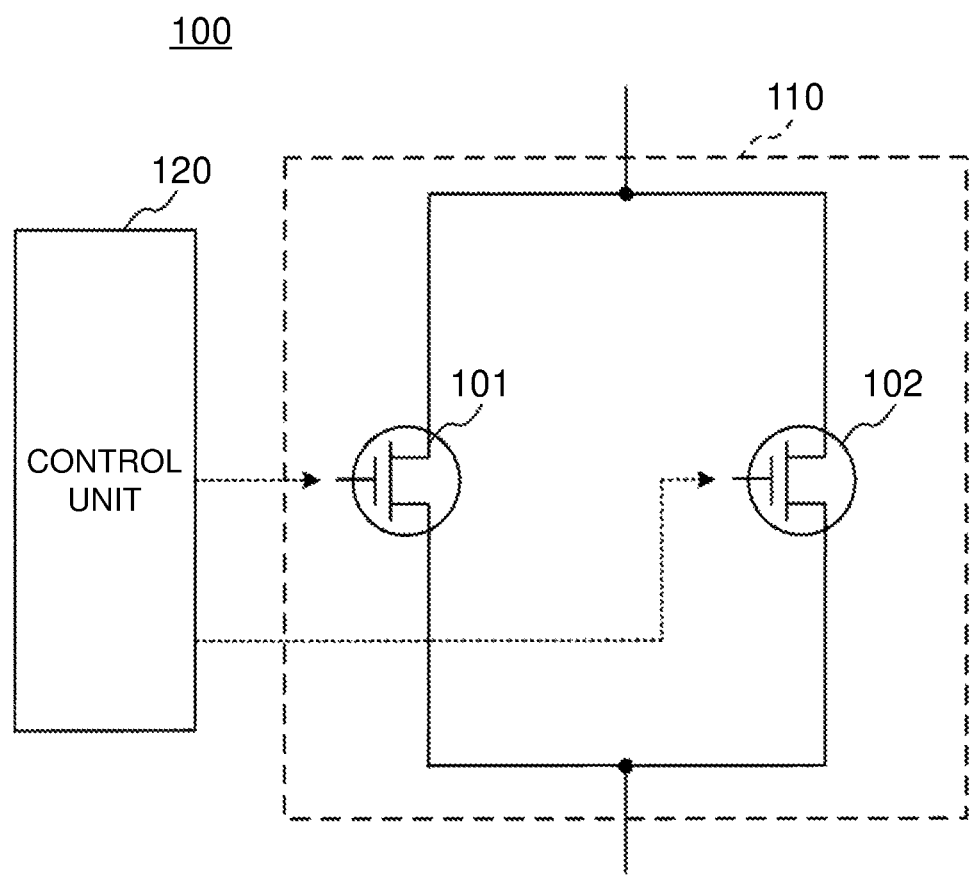
FIG. 1 is a circuit diagram of a power conversion device according to a first embodiment of this disclosure.

FIG. 1 is a circuit diagram of a power conversion device 100 according to a first embodiment of this disclosure. The power conversion device 100 includes a switching circuit 110 and a control unit 120.

The switching circuit 110 includes a first switching element 101 and a second switching element 102. The first switching element 101 and the second switching element 102 are connected in parallel to each other.

The first switching element 101 and the second switching element 102 are each a self-turn-off semiconductor element. For example, the first switching element 101 and the second switching element 102 are each a silicon metal oxide semiconductor field effect transistor (Si-MOSFET).

Further, the first switching element 101 and the second switching element 102 may each be a wide bandgap semiconductor element made of, for example, silicon carbide (SiC) or gallium nitride (GaN). As another example, the first switching element 101 and the second switching element 102 may each be a diamond semiconductor element.

The control unit 120 controls each of switching operations of the first switching element 101 and the second switching element 102, to thereby control the switching circuit 110.

More specifically, the control unit 120 controls a gate signal of the first switching element 101, to thereby control the switching operation of the first switching element 101.

Further, the control unit 120 controls a gate signal of the second switching element 102, to thereby control the switching operation of the second switching element 102.

First, before an operation of the power conversion device 100 according to the first embodiment is described, an operation of the switching circuit 110 of FIG. 1 in control according to Comparative Example is described with reference to FIG. 2 and FIG. 3.

Figure 2:
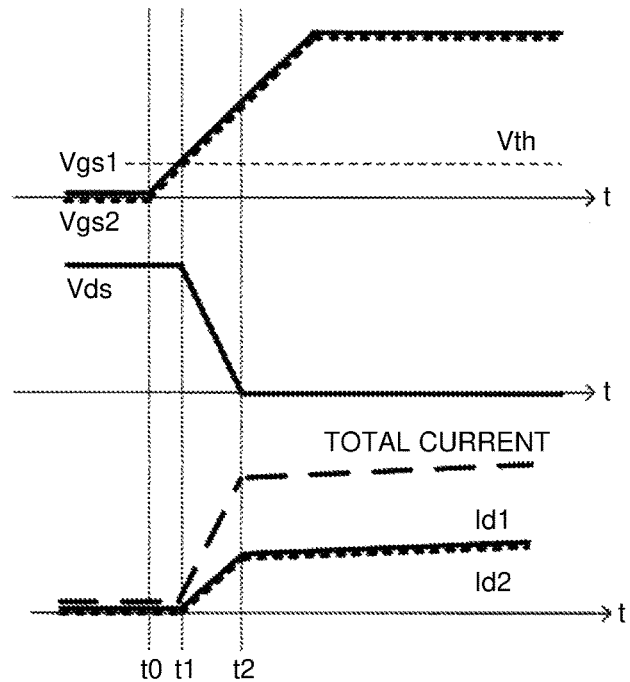
FIG. 2 is a chart for illustrating operation waveforms in a case in which, in control according to Comparative Example, no consideration is given to variations in threshold values of a first switching element and a second switching element.

FIG. 2 is a chart for illustrating operation waveforms of the first switching element 101 and the second switching element 102 in the control according to Comparative Example. FIG. 2 shows an ideal case in which there are no variations in various characteristics of the two switching elements 101 and 102. When there are no variations in the various characteristics of the two switching elements 101 and 102, the two switching elements 101 and 102 have all equal threshold voltages, equal gate resistances, and equal parasitic inductances of current paths.

At a time t0 of FIG. 2, the control unit 120 increases both of gate signals of the first switching element 101 and the second switching element 102. In this manner, both of a gate-source voltage Vgs1 of the first switching element 101 and a gate-source voltage Vgs2 of the second switching element 102 start to rise.

At a time t1, both of the gate-source voltage Vgs1 of the first switching element 101 and the gate-source voltage Vgs2 of the second switching element 102 reach a threshold voltage Vth.

In this manner, both of turn-on operations of the first switching element 101 and the second switching element 102 are started. Specifically, both of a drain current Id1 of the first switching element 101 and a drain current Id2 of the second switching element 102 start to flow. At the same time, a drain-source voltage Vds which is common between the first switching element 101 and the second switching element 102 starts to fall.

At a time t2, the drain-source voltage Vds becomes zero. In this manner, both of the turn-on operations of the first switching element 101 and the second switching element 102 are finished. That is, both of the first switching element 101 and the second switching element 102 are in a conductive state.

In a time period from the time t1 to the time t2, switching losses are caused in both of the first switching element 101 and the second switching element. At this time, in an ideal case in which there are no variations in the various characteristics of the two switching elements 101 and 102, the switching losses of the two switching elements 101 and 102 become equal to each other. However, in an actual case in which there are variations in the various characteristics of the two switching elements 101 and 102, the switching losses of the two switching elements 101 and 102 do not become equal to each other.

Figure 3:
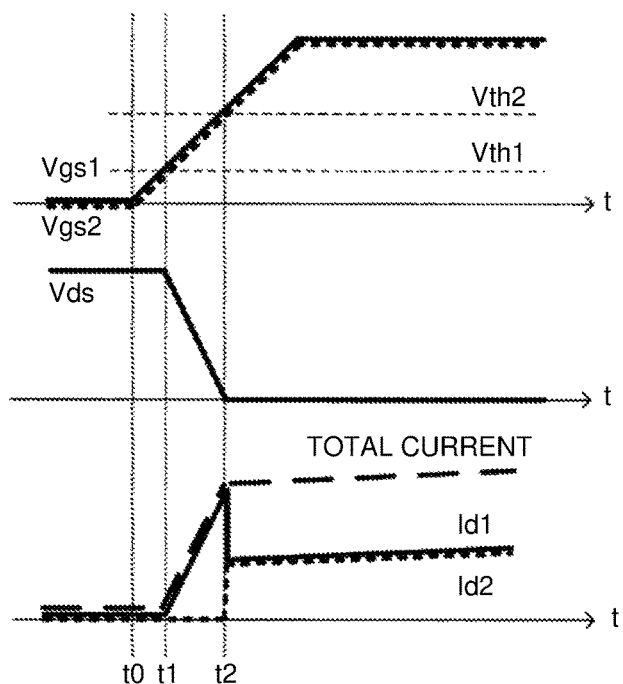
FIG. 3 is a chart for illustrating operation waveforms in a case in which, in the control according to Comparative Example, consideration is given to the variations in the threshold voltages of the first switching element and the second switching element.

FIG. 3 is a chart for illustrating operation waveforms in a case in which, in the control according to Comparative Example, consideration is given to the variations in the threshold voltages of the two switching elements 101 and 102.

At a time t0 of FIG. 3, the control unit 120 increases both of gate signals of the first switching element 101 and the second switching element 102. In this manner, both of the gate-source voltage Vgs1 of the first switching element 101 and the gate-source voltage Vgs2 of the second switching element 102 start to rise.

At a time t1, the gate-source voltage Vgs1 of the first switching element 101 reaches a threshold voltage Vth1. In this manner, a turn-on operation of the first switching element 101 is started. Specifically, the drain current Id1 of the first switching element 101 starts to flow, and simultaneously the drain-source voltage Vds starts to fall.

At this time, the gate-source voltage Vgs2 of the second switching element 102 has not reached a threshold voltage Vth2. Accordingly, the second switching element 102 is in a non-conductive state, and the drain current Id2 is zero.

At the time t2, the gate-source voltage Vgs2 of the second switching element 102 reaches the threshold voltage Vth2. In this manner, the turn-on operation of the second switching element 102 is started, and the drain current Id2 starts to flow.

At this time, the drain-source voltage Vds is zero. Accordingly, the turn-on operation of the second switching element 102 is zero voltage switching. Thus, the switching loss at the time of the turn-on operation of the second switching element 102 is zero.

In contrast, in the first switching element 101, in the time period from the time t1 to the time t2, the switching loss is caused. In general, a switching loss Psw of a switching element is proportional to a drain current and a drain-source voltage at the time of the switching operation.

Now, comparison is made between the case of FIG. 3 in which consideration is given to the variations in the threshold voltages of the two switching elements 101 and 102 and the ideal case of FIG. 2 in which no consideration is given to the variations in the threshold voltages of the two switching elements 101 and 102.

In the time period from the time t1 to the time t2, the drain current Id1 of the first switching element 101 of FIG. 3 is two times as large as the drain current Id1 of the second switching element 101 of FIG. 2. Thus, the switching loss of the first switching element 101 of FIG. 3 is two times as large as the switching loss of the first switching element 101 of FIG. 2.

In consideration of the above, the maximum switching loss Psw_max [W] of the first switching element 101 in the case of FIG. 3 in which consideration is given to the variations in the threshold voltages of the two switching elements 101 and 102 is expressed by the following expression.

$$Psw\_max = 2 \times Psw\_ref \times fsw \qquad (1)$$

In the expression above, Psw ref represents a switching loss in the ideal case of FIG. 2 in which no consideration is given to the variations in the threshold voltages of the two switching elements 101 and 102. Further, "fsw" represents a switching frequency of the switching circuit 110.

Next, an operation of the power conversion device 100 according to the first embodiment is described with reference to FIG. 4 to FIG. 6.

Figure 4:
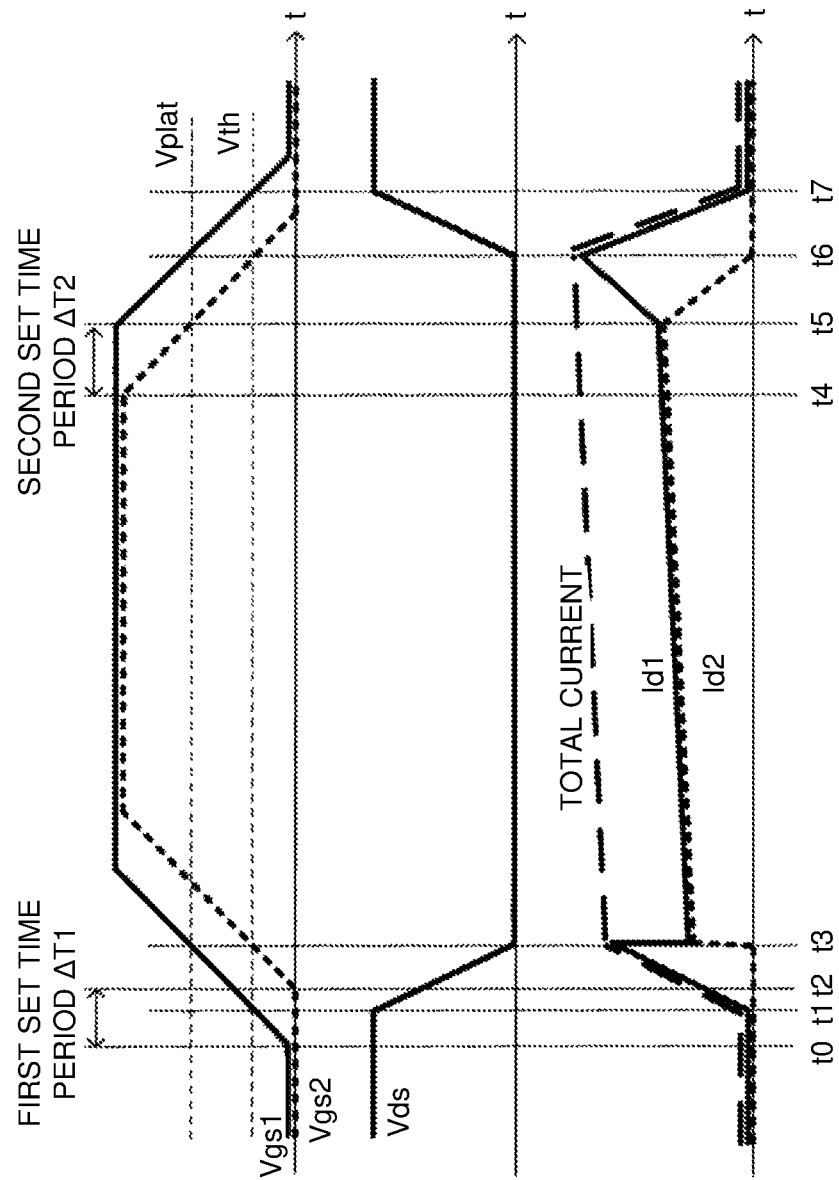
FIG. 4 is a chart for illustrating operation waveforms in a case in which, in the power conversion device of FIG. 1, there are no variations in various characteristics of the first switching element and the second switching element.

FIG. 4 is a chart for illustrating operation waveforms of the first switching element 101 and the second switching element 102 in the power conversion device 100 according to the first embodiment.

FIG. 4 shows an ideal case in which there are no variations in various characteristics of the two switching elements 101 and 102. This case is shown for facilitating the following description, and the following description made with reference to FIG. 4 can be easily expanded also for the actual case in which there are variations in the various characteristics of the two switching elements 101 and 102.

Further, in FIG. 4, the number of switching elements is 2. However, the following description is similarly applicable also to a case in which the number of switching elements is 3 or more.

First, the turn-on operation of the switching circuit 110 is described. At a time t0 of FIG. 4, the control unit 120 selects, from the first switching element 101 and the second switching element 102, the first switching element 101 as a "first target switching element." Then, the control unit 120 increases the gate signal of the first switching element 101 being the first target switching element. In this manner, the gate-source voltage Vgs1 of the first switching element 101 starts to rise.

At a time t1, the gate-source voltage Vgs1 of the first switching element 101 reaches the threshold voltage Vth. In this manner, the turn-on operation of the first switching element 101 is started. Specifically, the drain current Id1 of the first switching element 101 starts to flow, and simultaneously the drain-source voltage Vds starts to fall.

At this time, the gate-source voltage Vgs2 of the second switching element 102 being the other switching element that is not the first target switching element is still zero, and has not reached the threshold voltage Vth. Accordingly, the second switching element 102 is in the non-conductive state, and the drain current Id2 is zero.

At a time t2, the control unit 120 increases the gate signal of the second switching element 102. In this manner, the gate-source voltage Vgs2 of the second switching element 102 starts to rise. At this time, the drain current Id1 of the first switching element 101 continuously rises, and simultaneously the drain-source voltage Vds continuously falls.

At a time t3, the gate-source voltage Vgs2 of the second switching element 102 reaches the threshold voltage Vth. In this manner, the turn-on operation of the second switching element 102 is started, and the drain current Id2 starts to flow.

At this time, the drain-source voltage Vds is zero. In other words, the control unit 120 sets the above-mentioned time t2 so that the turn-on operation of the second switching element 102 is started at the timing at which the drain-source voltage Vds becomes zero.

The turn-on operation of the second switching element 102 is zero voltage switching because the drain-source voltage Vds is zero at the time t3. Thus, the switching loss at the time of the turn-on operation of the second switching element 102 is zero.

In contrast, in the first switching element 101, in the time period from the time t1 to the time t3, the switching loss is caused.

In this case, a time at which the rising of the gate-source voltage of the switching element is started is referred to as a "turn-on start time." Thus, the turn-on start time of the first switching element 101 is the time t0. Further, the turn-on start time of the second switching element 102 is the time t2. Moreover, a first set time period $\Delta T1$ is defined as "t2−t0."

When the operation so far is summarized through use of the above-mentioned terms, the control unit 120 performs control so that, at the time of the turn-on operation of the switching circuit 110, the turn-on start time of the first switching element 101 being the first target switching element is earlier by the first set time period $\Delta T1$ than the turn-on start time of the second switching element 102 being the other switching element that is not the first target switching element.

The first set time period $\Delta T1$="t2−t0" is set so as to be equal to a turn-on time period "t3−t1" in the turn-on operation of the first switching element 101 being the first target switching element. In this manner, the switching loss at the time of the turn-on operation of the second switching element 102 can be zero.

In FIG. 4, the control unit 120 selects the first switching element 101 as the first target switching element. Then, the control unit 120 performs control so that, at the time of the turn-on operation of the switching circuit 110, the turn-on start time of the first switching element 101 is earlier by the first set time period $\Delta T1$ than the turn-on start time of the second switching element 102.

Instead, the second switching element 102 may be selected as the first target switching element. In this case, the control unit 120 performs control so that, at the time of the turn-on operation of the switching circuit 110, the turn-on start time of the second switching element 102 is earlier by the first set time period $\Delta T1$ than the turn-on start time of the first switching element 101.

Further, in this case, the first set time period $\Delta 1$ is set so as to be equal to the turn-on time period in the turn-on operation of the second switching element 102. In this manner, the switching loss at the time of the turn-on operation of the first switching element 101 can be zero.

Next, the operation performed at the time of turn-off of the switching circuit 110 is described. At the time t4 of FIG. 4, the control unit 120 selects, from the first switching element 101 and the second switching element 102, the first switching element 101 as a "second target switching element." Then, the control unit 120 reduces the gate signal of the second switching element 102 being the other switching element that is not the second target switching element. In this manner, the gate-source voltage Vgs2 of the second switching element 102 starts to fall.

At this time, the gate-source voltage Vgs1 of the first switching element 101 being the second target switching element does not change. Accordingly, the first switching element 101 is still in the conductive state.

At a time t5, the gate-source voltage Vgs2 of the second switching element 102 falls below a mirror voltage Vplat. In this manner, the turn-off operation of the second switching element 102 is started. Specifically, the drain current Id2 of the second switching element 102 starts to decrease. However, the drain-source voltage Vds is still zero.

Further, at the time t5, the control unit 120 reduces the gate signal of the first switching element 101. In this manner, the gate-source voltage Vgs1 of the first switching element 101 starts to fall.

At a time t6, the gate-source voltage Vgs1 of the first switching element 101 falls below the mirror voltage Vplat. In this manner, the turn-off operation of the first switching element 101 is started. Specifically, the drain current Id1 of the first switching element 101 starts to fall, and simultaneously the drain-source voltage Vds starts to rise.

At this time, the turn-off operation of the second switching element 102 is finished, and the drain current Id2 is zero. In other words, the control unit 120 sets the above-mentioned time t5 so that the turn-off operation of the first switching element 101 is finished at the timing at which the drain current Id2 becomes zero.

At a time t7, the turn-off operation of the first switching element 101 is finished, and the drain current Id1 becomes zero.

In a time period from the time t5 to the time t6, the turn-off operation of the second switching element 102 is zero voltage switching because the drain-source voltage Vds is zero. Thus, the switching loss at the time of the turn-off operation of the second switching element 102 is zero.

In contrast, in the first switching element 101, in the time period from the time t6 to the time t7, the switching loss is caused.

In this case, a time at which the falling of the gate-source voltage of the switching element is started is referred to as a "turn-off start time." Thus, the turn-off start time of the second switching element 102 is the time t4. Further, the turn-off start time of the first switching element 101 is the time t5. Moreover, a second set time period ΔT2 is defined as "t5−t4."

When the operation so far is summarized through use of the above-mentioned terms, the control unit 120 performs control so that, at the time of the turn-off operation of the switching circuit 110, the turn-off start time of the first switching element 101 being the second target switching element is later by the second set time period ΔT2 than the turn-off start time of the second switching element 102 being the other switching element that is not the second target switching element.

The second set time period ΔT2="t5−t4" is set so as to be equal to a turn-off time period "t6−t5" in the turn-off operation of the second switching element 102 being the other switching element that is not the second target switching element. In this manner, the switching loss at the time of the turn-off operation of the second switching element 102 can be zero.

In FIG. 4, the control unit 120 selects the first switching element 101 as the second target switching element. Then, the control unit 120 performs control so that, at the time of the turn-off operation of the switching circuit 110, the turn-off start time of the first switching element 102 is later by the second set time period ΔT2 than the turn-off start time of the second switching element 102.

Instead, the second switching element 102 may be selected as the second target switching element. In this case, the control unit 120 performs control so that, at the time of the turn-off operation of the switching circuit 110, the turn-off start time of the second switching element 102 is later by the second set time period ΔT2 than the turn-off start time of the first switching element 101.

Further, in this case, the second set time period Δ2 is set so as to be equal to the turn-off time period in the turn-off operation of the first switching element 101. In this manner, the switching loss at the time of the turn-off operation of the second switching element 102 can be zero.

FIG. 4 shows only one cycle of the switching operation of the switching circuit 110, that is, only one turn-on operation and one turn-off operation. However, in the actual operation of the switching circuit 110, the turn-on operation and the turn-off operation are repeated for certain cycles.

Accordingly, the control unit 120 changes each of the first target switching element and the second target switching element for each first set cycle TP1 corresponding to an integer multiple of a switching cycle of the switching circuit 110, where the integer is 1 or more.

Further, it is preferred that the control unit 120 cause, in the second set cycle corresponding to an integer multiple of the first set cycle TP1, where the integer is 2 or more, each of the first switching element 101 and the second switching element 102 to be selected as the first target switching element an equal number of times.

Similarly, it is preferred that the control unit 120 cause, in the second set cycle corresponding to an integer multiple of the first set cycle TP1, where the integer is 2 or more, each of the first switching element 101 and the second switching element 102 to be selected as the second target switching element an equal number of times.

Figure 5:
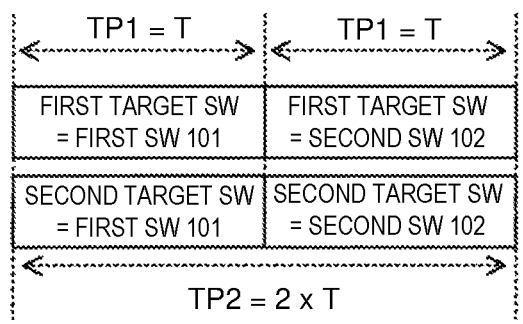
FIG. 5 is an example of a case of, in the power conversion device of FIG. 1, a first set cycle TP1=T and a second set cycle TP2=2×T.

FIG. 5 is an example of a case of the first set cycle TP1=T and the second set cycle TP2=2×T, where T represents the switching cycle of the switching circuit 110. In FIG. 5, the first target switching element and the second target switching element are the same.

In FIG. 5, in the first cycle, the first switching element 101 is selected as the first target switching element and the second target switching element. Further, in the second cycle, the second switching element 102 is selected as the first target switching element and the second target switching element. The same is repeated thereafter.

Figure 6:
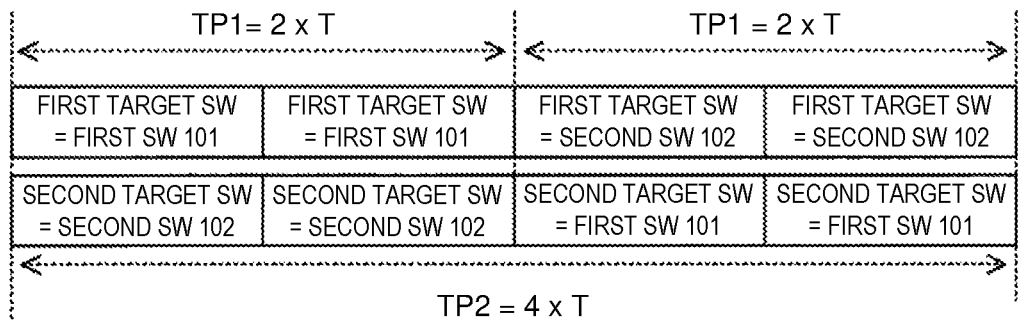
FIG. 6 is an example of a case of, in the power conversion device of FIG. 1, the first set cycle TP1=2×T and the second set cycle TP2=4×T.

FIG. 6 is an example of a case of the first set cycle TP1=2×T and the second set cycle TP2=4×T, where T represents the switching cycle of the switching circuit 110. In FIG. 6, the first target switching element and the second target switching element are not the same.

In FIG. 6, in the first cycle and the second cycle, the first switching element 101 is selected as the first target switching element, and the second switching element 102 is selected as the second target switching element. Further, in the third cycle and the fourth cycle, the second switching element 102 is selected as the first target switching element, and the first switching element 101 is selected as the second target switching element.

Through the above-mentioned control, in the second set cycle TP2, the switching losses in the first switching element 101 and the second switching element 102 can be equalized.

Subsequently, consideration is given to a case in which, in the second set cycle TP2, the number of times that the first switching element 101 is selected as the first target switching element is equal to the number of times that the second switching element 102 is selected as the first target switching element, and the number of times that the first switching element 101 is selected as the second target switching element is also equal to the number of times that the second switching element 102 is selected as the second target switching element.

At this time, the maximum switching loss Psw_max,new [W] in the two switching elements 101 and 102 is expressed by the following expression.

$$Psw\_max,new = 2 \times Psw\_ref \times fsw \times (\tfrac{1}{2}) \qquad (2)$$

In the expression above, Psw ref represents a switching loss in the ideal case of FIG. 2 in which no consideration is given to the variations in the threshold voltages of the two switching elements 101 and 102. Further, "fsw" represents a switching frequency of the switching circuit 110.

When Expression (2) and Expression (1) are compared with each other, in the power conversion device 100 according to the first embodiment, the maximum switching loss Psw_max,new in the two switching elements 101 and 102 is ½ of the maximum switching loss Psw_max in Comparative Example.

However, the description described above assumes the ideal case in which it is expected that the two switching elements 101 and 102 have equal various characteristics, such as equal threshold voltages, equal gate resistances, and equal parasitic inductances of the current paths. Accordingly, the first set time period ΔT1 is set so as to be equal to the turn-on time period in the turn-on operation of the first target switching element. Further, the second set time period ΔT2 is set so as to be equal to the turn-off time period in the turn-off operation of the other switching element that is not the second target switching element.

However, as described above, in the actual case, the two switching elements 101 and 102 have variations in the various characteristics such as the threshold voltages, the gate resistances, and the parasitic inductances of the current paths.

In order to address this problem, in the first embodiment, the first set time period ΔT1 is set so as to be equal to or longer than the turn-on time period in the turn-on operation of the first target switching element. Further, the second set time period ΔT2 is set so as to be equal to or longer than the turn-off time period in the turn-off operation of the other switching element that is not the second target switching element. With the above-mentioned setting, the variations in the various characteristics of the two switching elements 101 and 102 can be absorbed.

Figure 7:
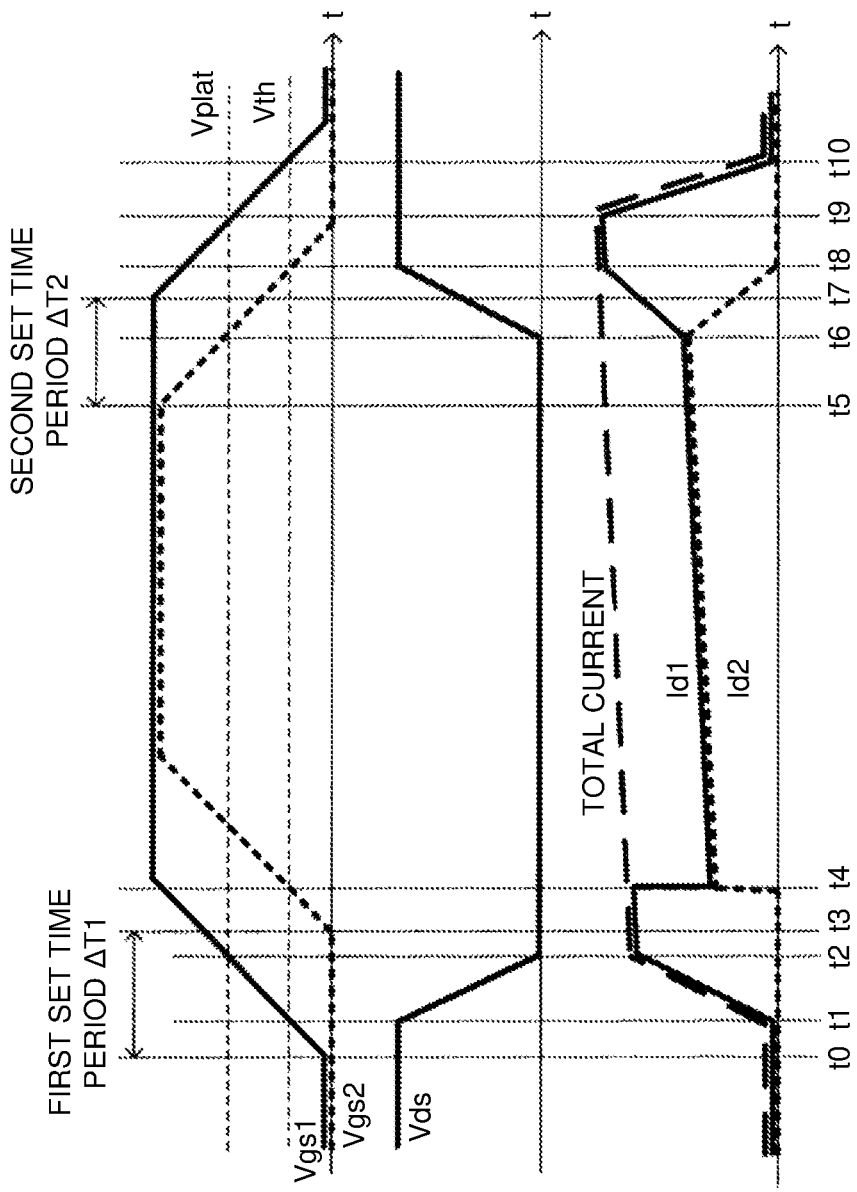
FIG. 7 is a chart for illustrating operation waveforms in a case in which, in the power conversion device of FIG. 1, there are variations in the various characteristics of the first switching element and the second switching element.

FIG. 7 is a chart for illustrating operation waveforms of the first switching element 101 and the second switching element 102 in a case in which there are variations in the various characteristics of the two switching elements 101 and 102. In FIG. 7, the first switching element 101 is selected as the first target switching element and the second target switching element.

In FIG. 7, the first set time period $\Delta T1$="t3−t0" is set so as to be longer than the turn-on time period "t2−t1" in the turn-on operation of the first switching element 101 being the first target switching element.

Further, the second set time period $\Delta T2$="t7−t5" is set so as to be longer than the turn-off time period "t8−t6" in the turn-off operation of the second switching element 102 being the other switching element that is not the second target switching element.

In the power conversion device 100 according to the first embodiment, the first set time period $\Delta T1$ and the second set time period $\Delta T2$ are set as described above. Thus, even when there are variations in the various characteristics of the two switching elements 101 and 102, the maximum switching loss in the two switching elements 101 and 102 can be reduced.

In FIG. 7, in a time period from the time t2 to the time t4 and a time period from the time t8 to the time t9, only the first switching element 101 is in the conductive state. Accordingly, there is a fear in that the conduction loss of the first switching element 101 is increased in those time periods.

However, each of the turn-on time period and the turn-off time period of a general switching element is about several tens of nanoseconds. Accordingly, each of the first set time period $\Delta T1$ and the second set time period $\Delta T2$ of FIG. 7 is about several tens of nanoseconds. Thus, in one cycle of FIG. 7, the time period in which only the first switching element 101 is in the conductive state is about several nanoseconds.

Further, a drive frequency of a general power conversion device is from about several tens of kHz to about several hundreds of kHz. Accordingly, in one cycle of FIG. 7, the total time period in which the first switching element 101 is in the conductive state is about several microseconds. Thus, the influence of the increase of the conduction loss in the time period in which only the first switching element 101 is in the conductive state, which is about several nanoseconds, is extremely small.

As described above, in the power conversion device 100 according to the first embodiment, the control unit 120 selects, in each first set cycle TP1, each of the first target switching element and the second target switching element from the two switching elements 101 and 102. The first set cycle TP1 corresponds to an integer multiple of the switching cycle T of the switching circuit 110, where the integer is 1 or more.

In more general, the control unit 120 is configured to select, in each first set cycle TP1 corresponding to an integer multiple of the switching cycle T of the switching circuit 110, where the integer is 1 or more, the first target switching element and the second target switching element from the M switching elements, the number of first target switching elements being 1 or more and less than M, the number of second target switching elements being 1 or more and less than M. At this time, the first target switching element and the second target switching element may be the same or may be different from each other.

The control unit 120 performs control so that, at the time of the turn-on operation of the switching circuit 110, the turn-on start time of the first target switching element is earlier by the first set time period $\Delta T1$ than the turn-on start time of another switching element that is not the first target switching element. It should be noted that the first set time period $\Delta T1$ is set so as to be equal to or longer than the turn-on time period in the turn-on operation of the first target switching element.

Further, the control unit 120 performs control so that, at the time of the turn-off operation of the switching circuit 110, the turn-off start time of the second target switching element is later by the second set time period $\Delta T2$ than the turn-off start time of another switching element that is not the second target switching element. It should be noted that the second set time period $\Delta T2$ is set so as to be equal to or longer than the turn-off time period in the turn-off operation of the another switching element that is not the second target switching element.

With the above-mentioned feature, in the power conversion device 100 according to the first embodiment, even when there are variations in the various characteristics of the plurality of switching elements connected in parallel to each other, the maximum switching loss in the plurality of switching elements can be reduced without increasing the number of manufacturing steps and the manufacturing cost.

Further, when the maximum switching loss in the plurality of switching elements is reduced, the heat generation of the power conversion device 100 is suppressed. As a result, a cooler (not shown) to be mounted on the power conversion device 100 can be downsized and reduced in cost.

Further, in recent years, high-frequency driving of the power conversion device has been promoted through use of a switching element made of, for example, SiC or GaN, which is capable of high-speed switching. The conduction loss of the switching element is substantially unvaried when the drive frequency is high. In contrast, the switching loss of the switching element is increased in proportion to the drive frequency. Thus, a state in which the maximum switching loss in the plurality of switching elements can be reduced is very effective.

Further, in the power conversion device 100 according to the first embodiment, in the second set cycle TP2 corresponding to an integer multiple of the first set cycle TP1, where the integer is 2 or more, each of the plurality of switching elements is selected as the first target switching element an equal number of times, and each of the plurality of switching elements is also selected as the second target switching element an equal number of times. In this manner, the switching losses of the respective switching elements can be equalized.

Second Embodiment

Figure 8:
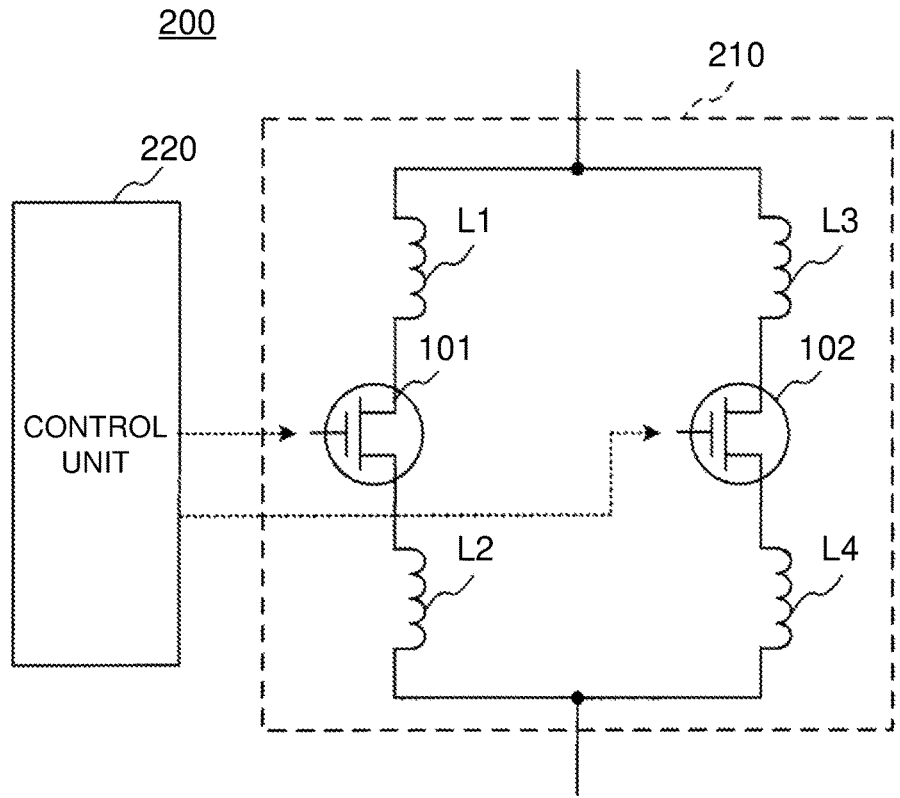
FIG. 8 is an equivalent circuit diagram in which consideration is given to a parasitic inductance of a current path in a power conversion device according to a second embodiment of this disclosure.

FIG. 8 is an equivalent circuit diagram in which consideration is given to a parasitic inductance of a current path in a power conversion device 200 according to a second embodiment of this disclosure. The power conversion device 200 includes a switching circuit 210 and a control unit 220. Symbols L1 to L4 of FIG. 8 represent parasitic inductances present in a current path such as a substrate pattern or a bus bar of the switching circuit 210.

In Patent Literature 1 described above, in the current path of each of the plurality of switching elements connected in parallel to each other, the sum of the self-inductance and the mutual inductance is set so as to be equal so that the currents flowing through the respective switching elements are equalized.

However, in Patent Literature 1, in order to equalize the sum of the self-inductance and the mutual inductance in the current path of each of the plurality of switching elements, the layout of the switching circuit is required to be devised. As a result, for example, a longer and larger current path, a larger circuit size, and a reduced degree of freedom in layout are caused.

In contrast, in the power conversion device 200 according to the second embodiment, the control unit 220 is configured to determine, based on a parasitic inductance of a current path of each of the two switching elements 101 and 102, the number of times that each of the two switching elements 101 and 102 is selected as the first target switching element in the second set cycle TP2, and the number of times that each of the two switching elements 101 and 102 is selected as the second target switching element in the second set cycle TP2.

More specifically, the control unit 220 selects the number of times that each of the two switching elements 101 and 102 is selected as the first target switching element in the second set cycle TP2 and the number of times that each of the two switching elements 101 and 102 is selected as the second target switching element in the second set cycle TP2 so that a conduction loss difference which is based on a parasitic inductance difference between the two switching elements 101 and 102 is canceled out.

With the above-mentioned feature, in the power conversion device 200 according to the second embodiment, the conduction losses of the respective switching elements can be equalized without causing, for example, the longer and larger current path, the larger circuit size, and the reduced degree of freedom in layout.

Third Embodiment

Figure 9:
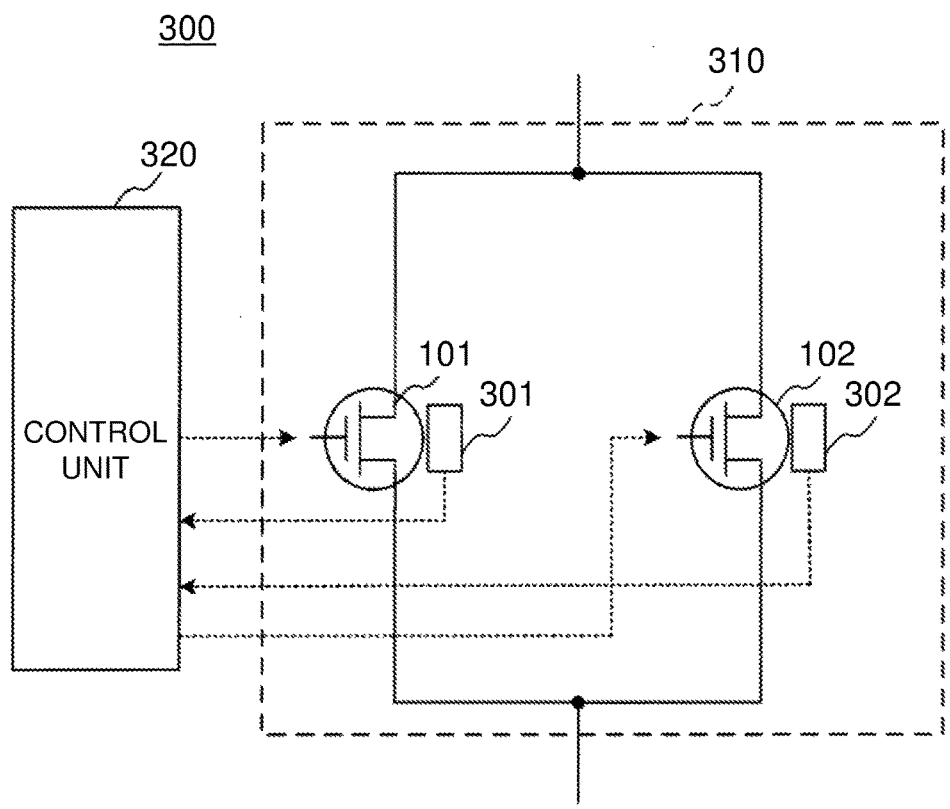
FIG. 9 is a circuit diagram of a power conversion device according to a third embodiment of this disclosure.

FIG. 9 is a circuit diagram of a power conversion device 300 according to a third embodiment of this disclosure. The power conversion device 300 includes a switching circuit 310, a control unit 320, a first temperature detector 301, and a second temperature detector 302.

The first temperature detector 301 detects the temperature of the first switching element 101 or the temperature around the first switching element 101. The second temperature detector 302 detects the temperature of the second switching element 102 or the temperature around the second switching element 102.

Depending on the layout inside or around the switching circuit 310, in some cases, the temperatures of the two switching elements 101 and 102 are greatly different from each other due to, for example, a cooling capability of the cooler (not shown) or heat interference from another heat generating component (not shown). Further, in other cases, the temperatures of the two switching elements 101 and 102 are greatly different from each other due to variations in conduction losses of the two switching elements 101 and 102.

The control unit 320 is configured to determine, based on each of the temperatures detected by the first temperature detector 301 and the second temperature detector 302, the number of times that each of the two switching elements 101 and 102 is selected as the first target switching element in a second set cycle TP2, and the number of times that each of the two switching elements 101 and 102 is selected as the second target switching element in the second set cycle TP2.

More specifically, the control unit 320 determines the number of times that each of the two switching elements 101 and 102 is selected as the first target switching element in the second set cycle TP2 and the number of times that each of the two switching elements 101 and 102 is selected as the second target switching element in the second set cycle TP2 so that the switching element having a higher temperature is selected as the first target switching element and the second target switching element more frequently.

With the above-mentioned feature, in the power conversion device 300 according to the third embodiment, the temperatures of the respective switching elements can be equalized.

Fourth Embodiment

Figure 10:
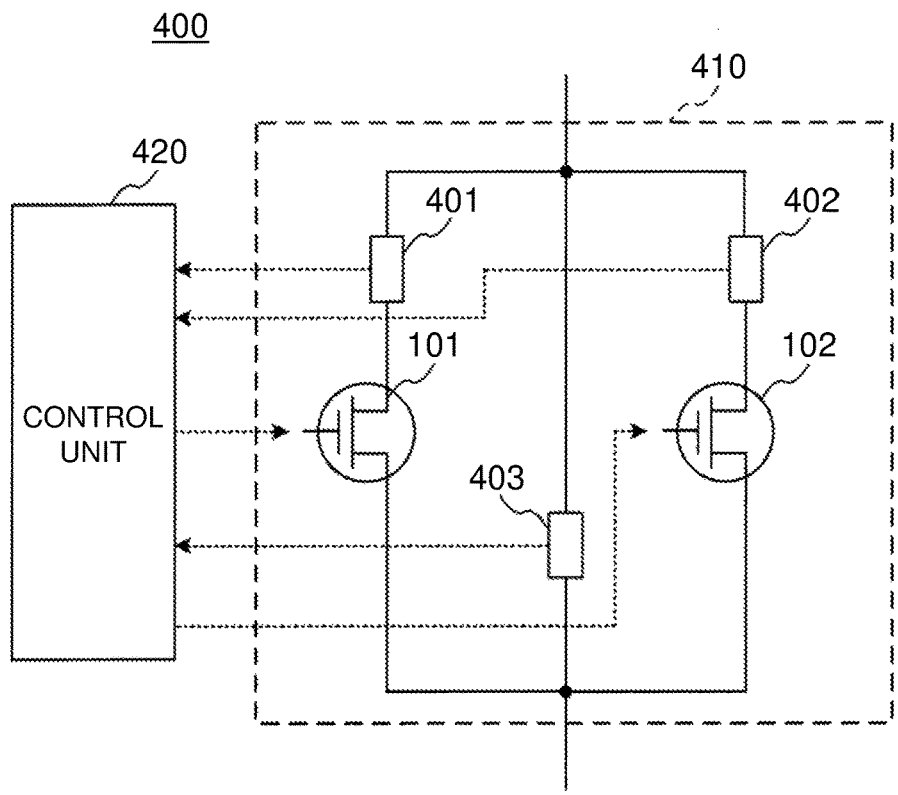
FIG. 10 is a circuit diagram of a power conversion device according to a fourth embodiment of this disclosure.

FIG. 10 is a circuit diagram of a power conversion device 400 according to a fourth embodiment of this disclosure. The power conversion device 400 includes a switching circuit 410, a control unit 420, a first current detector 401, a second current detector 402, and a voltage detector 403.

The first current detector 401 detects the drain current Id1 of the first switching element 101.

The second current detector 402 detects the drain current Id2 of the second switching element 102.

The voltage detector 403 detects the drain-source voltage Vds common between the two switching elements 101 and 102.

The control unit 420 determines an end time of the first set time period ΔT1 as a time at which the drain-source voltage Vds detected by the voltage detector 403 falls below a predetermined voltage threshold value.

Further, the control unit 420 determines an end time of the second set time period ΔT2 as a time at which the drain current of the other switching element that is not the second target switching element, which is detected by the first current detector 401 or the second current detector 402, falls below a predetermined current threshold value.

In FIG. 7 of the first embodiment described above, in order to cope with the variations in the various characteristics of the two switching elements 101 and 102, a time period in which only the first target switching element or the second target switching element is in the conductive state is provided.

In contrast, in the power conversion device 400 according to the fourth embodiment, the above-mentioned voltage threshold value and current threshold value are adjusted as appropriate so that the time period in which only the first target switching element or the second target switching element is in the conductive state can be reduced at the maximum. As a result, the operation waveforms of the two switching elements 101 and 102 can be made closer to the operation waveforms of FIG. 4 of the first embodiment described above.

Fifth Embodiment

Figure 11:
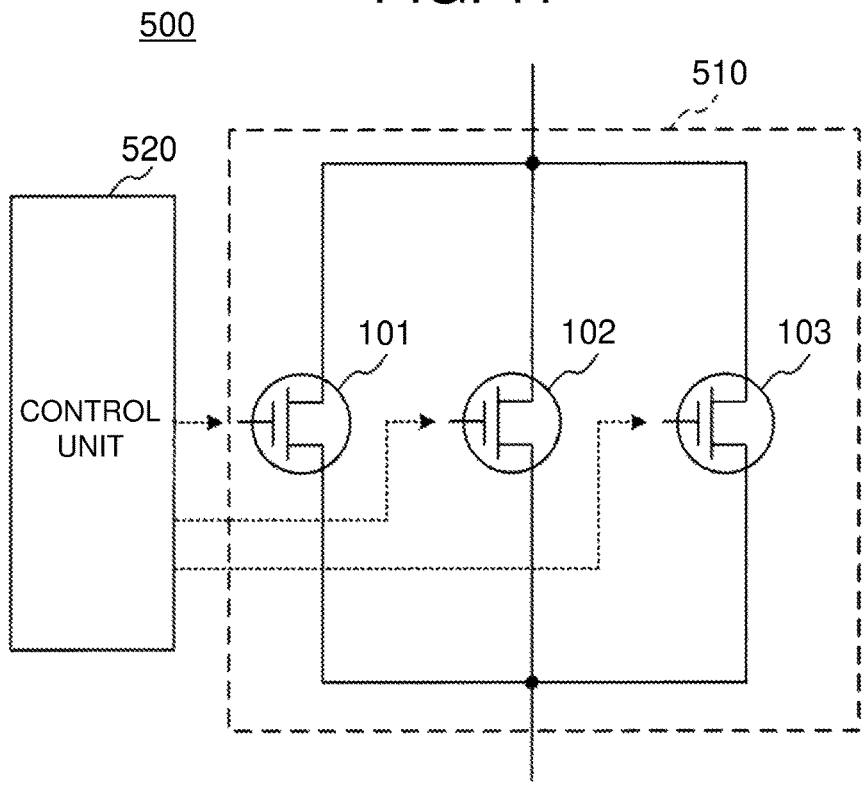
FIG. 11 is a circuit diagram of a power conversion device according to a fifth embodiment of this disclosure.

FIG. 11 is a circuit diagram of a power conversion device 500 according to a fifth embodiment of this disclosure. The power conversion device 500 includes a switching circuit 510 and a control unit 520. The switching circuit 510 includes first to third switching elements 101 to 103 connected in parallel to each other.

Figure 12:
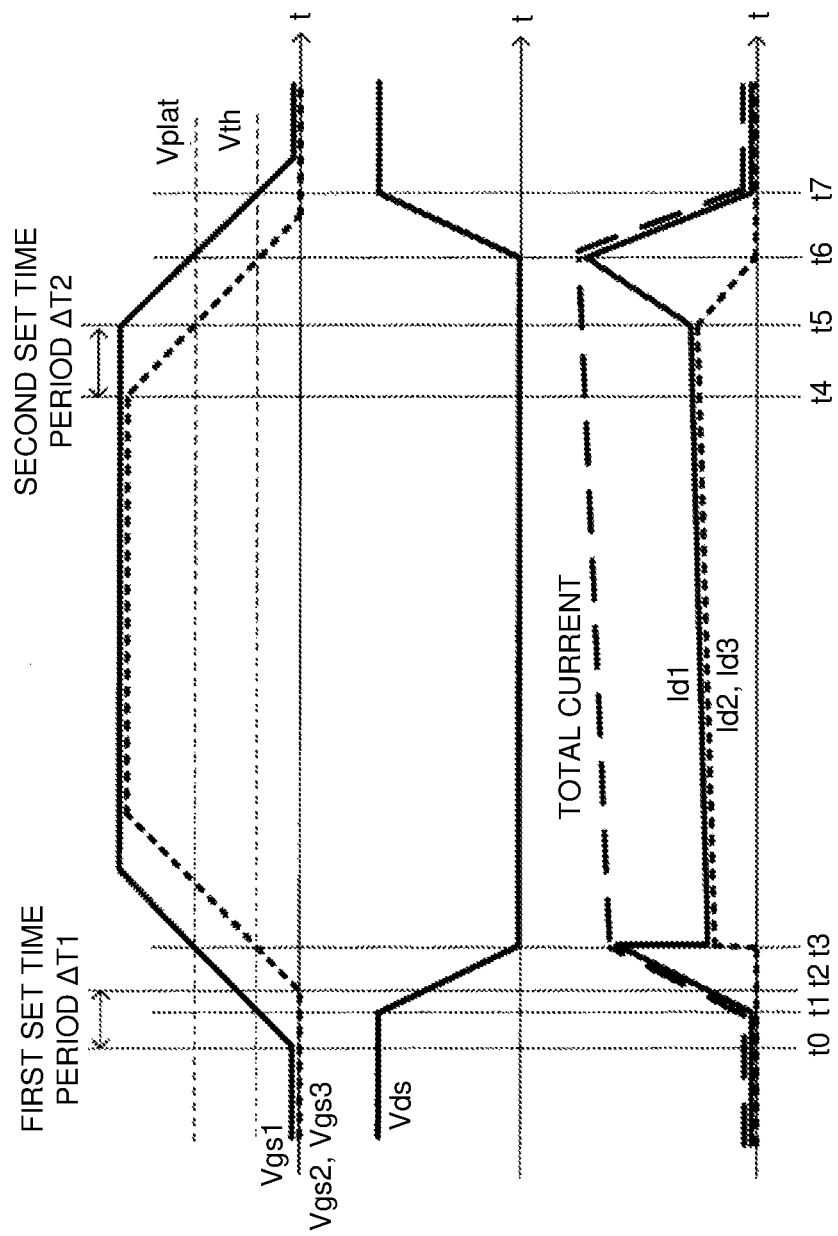
FIG. 12 is a chart for illustrating operation waveforms of first to third switching elements in the power conversion device of FIG. 11.

FIG. 12 is a chart for illustrating operation waveforms of the first to third switching elements 101 to 103 in the power conversion device 500 according to the fifth embodiment.

FIG. 12 shows an ideal case in which there are no variations in various characteristics of the three switching elements 101 to 103.

In FIG. 12, symbols Vgs1 to Vgs3 represent gate-source voltages of the switching elements 101 to 103, respectively. Further, symbols Id1 to Id3 represent drain currents of the switching elements 101 to 103, respectively.

When the operation waveforms of FIG. 12 and the operation waveforms of FIG. 4 of the first embodiment described above are compared with each other, the basic behavior is the same. However, in FIG. 12, the number of switching elements connected in parallel to each other is 3, and hence in a conductive time period from the time t3 to the time t5, each of the drain currents Id1 to Id3 of the respective switching elements 101 to 103 is ⅓ of the total current.

Further, in FIG. 12, the turn-on start time of the first switching element 101 being the first target switching element is earlier by the first set time period $\Delta T1$ than the turn-on start times of the second switching element 102 and the third switching element 103 being the other switching elements that are not the first target switching element. In this case, the switching losses at the time of the turn-on operations of the second switching element 102 and the third switching element 103 are zero.

Although not shown in FIG. 12, when the first target switching element is the second switching element 102, the switching losses at the time of the turn-on operations of the first switching element 101 and the third switching element 103 are zero.

Similarly, when the first target switching element is the third switching element 103, the switching losses at the time of the turn-on operations of the first switching element 101 and the second switching element 102 are zero.

Further, in FIG. 12, the turn-off start time of the first switching element 101 being the second target switching element is earlier by the second set time period $\Delta T2$ than the turn-off start times of the second switching element 102 and the third switching element 103 being the other switching elements that are not the second target switching element. In this case, the switching losses at the time of the turn-off operations of the second switching element 102 and the third switching element 103 are zero.

Although not shown in FIG. 12, when the second target switching element is the second switching element 102, the switching losses at the time of the turn-off operations of the first switching element 101 and the third switching element 103 are zero.

Similarly, when the second target switching element is the third switching element 103, the switching losses at the time of the turn-off operations of the first switching element 101 and the second switching element 102 are zero.

As described above, even when the number of switching elements connected in parallel to each other is 3, the switching losses of the plurality of switching elements can be equalized, and the maximum switching loss can be reduced. However, while the maximum switching loss is reduced to ½ in the first embodiment described above, in the third embodiment, the maximum switching loss is reduced to ⅓ because the number of switching elements is 3.

Sixth Embodiment

Figure 13:
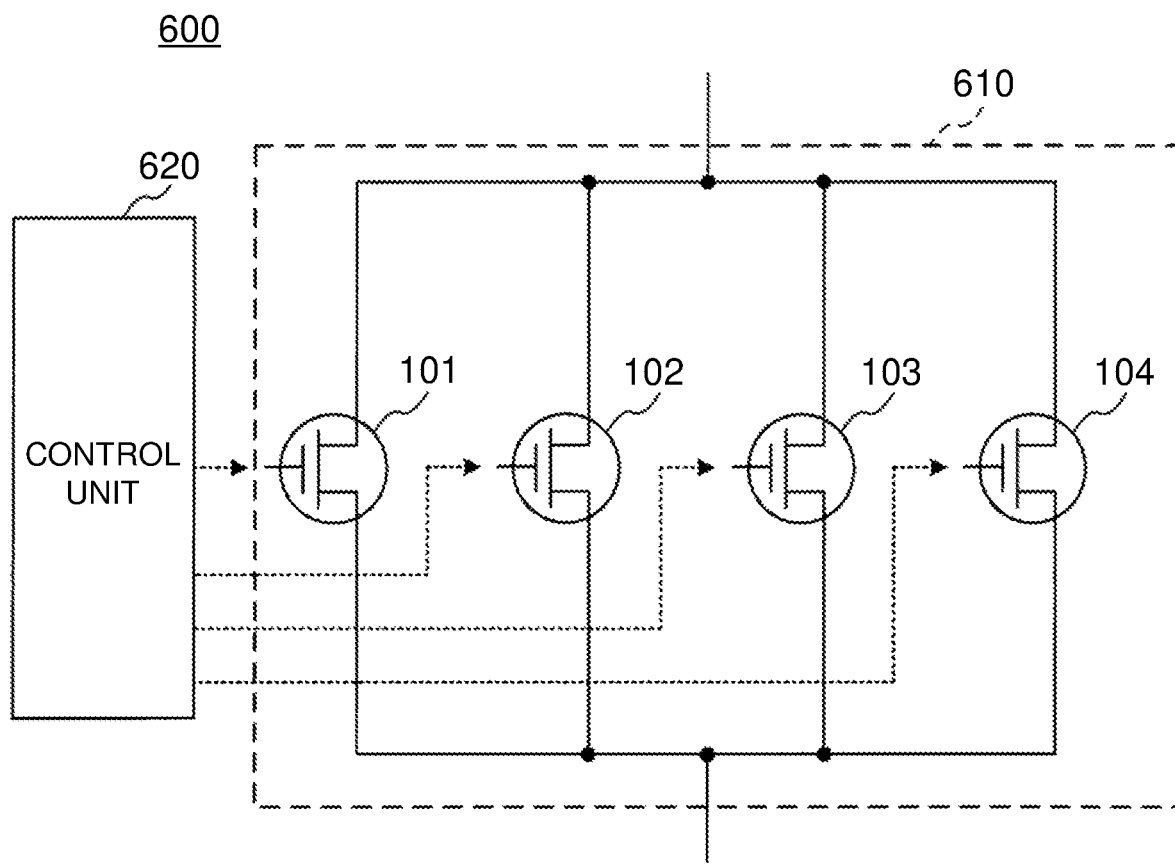
FIG. 13 is a circuit diagram of a power conversion device according to a sixth embodiment of this disclosure.

FIG. 13 is a circuit diagram of a power conversion device 600 according to a sixth embodiment of this disclosure. The power conversion device 600 includes a switching circuit 610 and a control unit 620. The switching circuit 610 includes first to fourth switching elements 101 to 104 connected in parallel to each other.

Figure 14:
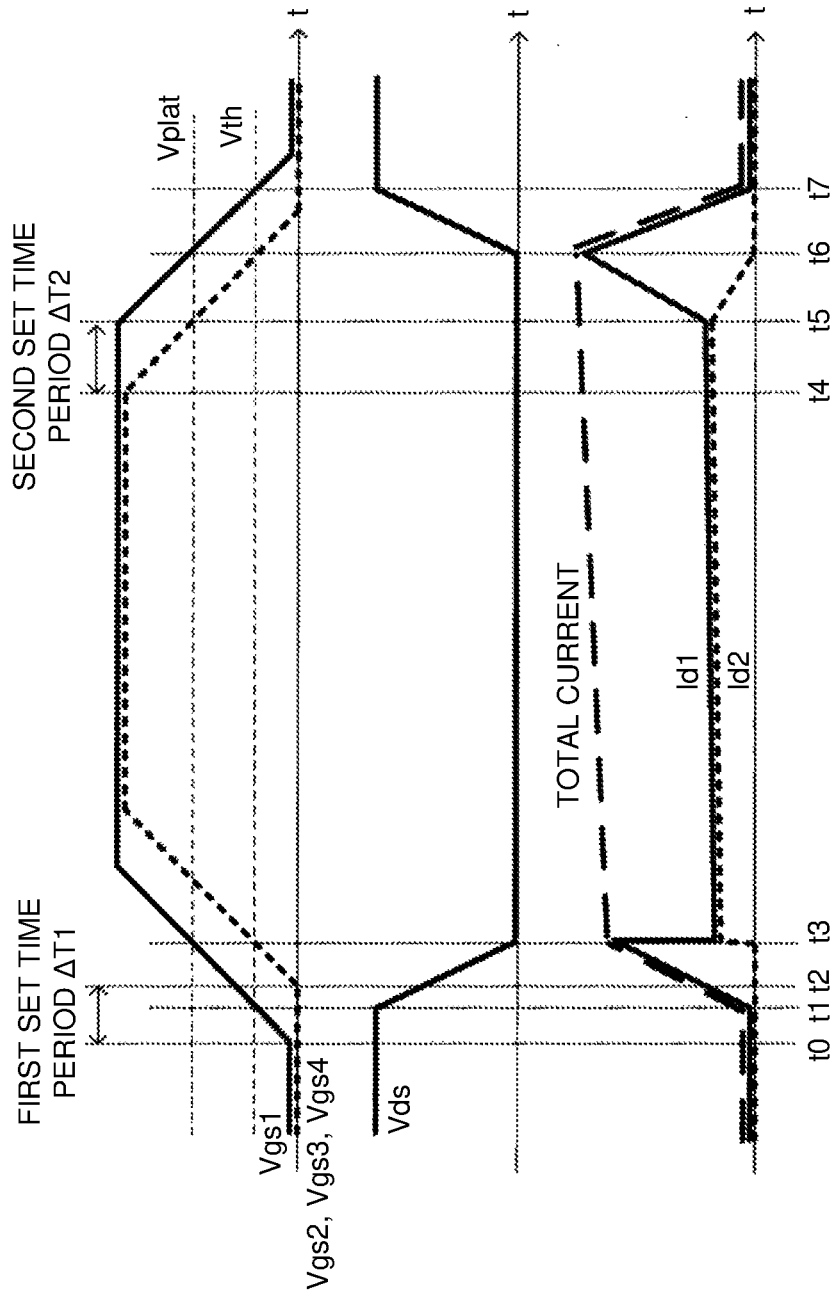
FIG. 14 is a chart for illustrating a first example of operation waveforms of first to fourth switching elements in the power conversion device of FIG. 13.

FIG. 14 is a chart for illustrating operation waveforms of the first to fourth switching elements 101 to 104 in the power conversion device 600 according to the sixth embodiment. FIG. 14 shows an ideal case in which there are no variations in various characteristics of the four switching elements 101 to 104.

In FIG. 14, symbols Vgs1 to Vgs4 represent gate-source voltages of the switching elements 101 to 104, respectively. Further, symbols Id1 to Id4 represent drain currents of the switching elements 101 to 104, respectively.

When the operation waveforms of FIG. 14 and the operation waveforms of FIG. 4 in the first embodiment described above are compared with each other, the basic behavior is the same. However, in FIG. 14, the number of switching elements connected in parallel to each other is 4, and hence in a conductive time period from the time t3 to the time t5, each of the drain currents Id1 to Id4 of the respective switching elements 101 to 104 is ¼ of the total current.

Further, in FIG. 14, the turn-on start time of the first switching element 101 being the first target switching element is earlier by the first set time period $\Delta T1$ than the turn-on start times of the second switching element 102 to the fourth switching element 104 being the other switching elements that are not the first target switching element. In this case, the switching losses at the time of the turn-on operations of the second switching element 102 to the fourth switching element 104 are zero.

Although not shown in FIG. 14, the same holds true also in the case in which each of the second switching element 102, the third switching element 103, and the fourth switching element 104 is selected as the first target switching element.

Further, in FIG. 14, the turn-off start time of the first switching element 101 being the second target switching element is earlier by the second set time period $\Delta T2$ than the turn-off start times of the second switching element 102 to the fourth switching element 104 being the other switching elements that are not the second target switching element. In this case, the switching losses at the time of the turn-off operations of the second switching element 102 to the fourth switching element 104 are zero.

Although not shown in FIG. 14, the same holds true also in the case in which each of the second switching element 102, the third switching element 103, and the fourth switching element 104 is selected as the second target switching element.

As described above, even when the number of switching elements connected in parallel to each other is 4, the switching losses of the plurality of switching elements can be equalized, and the maximum switching loss can be reduced. However, in the sixth embodiment, the maximum switching loss is reduced to ¼ because the number of switching elements is 4.

As described above, the number of switching elements to be selected as the first target switching element may be 2 or more. More specifically, when the number of switching elements connected in parallel to each other is M, it is only required that the number of first target switching elements be 1 or more and less than M.

Similarly, the number of switching elements to be selected as the second target switching element may be 2 or more. More specifically, when the number of switching elements connected in parallel to each other is M, it is only required that the number of second target switching elements be 1 or more and less than M.

Figure 15:
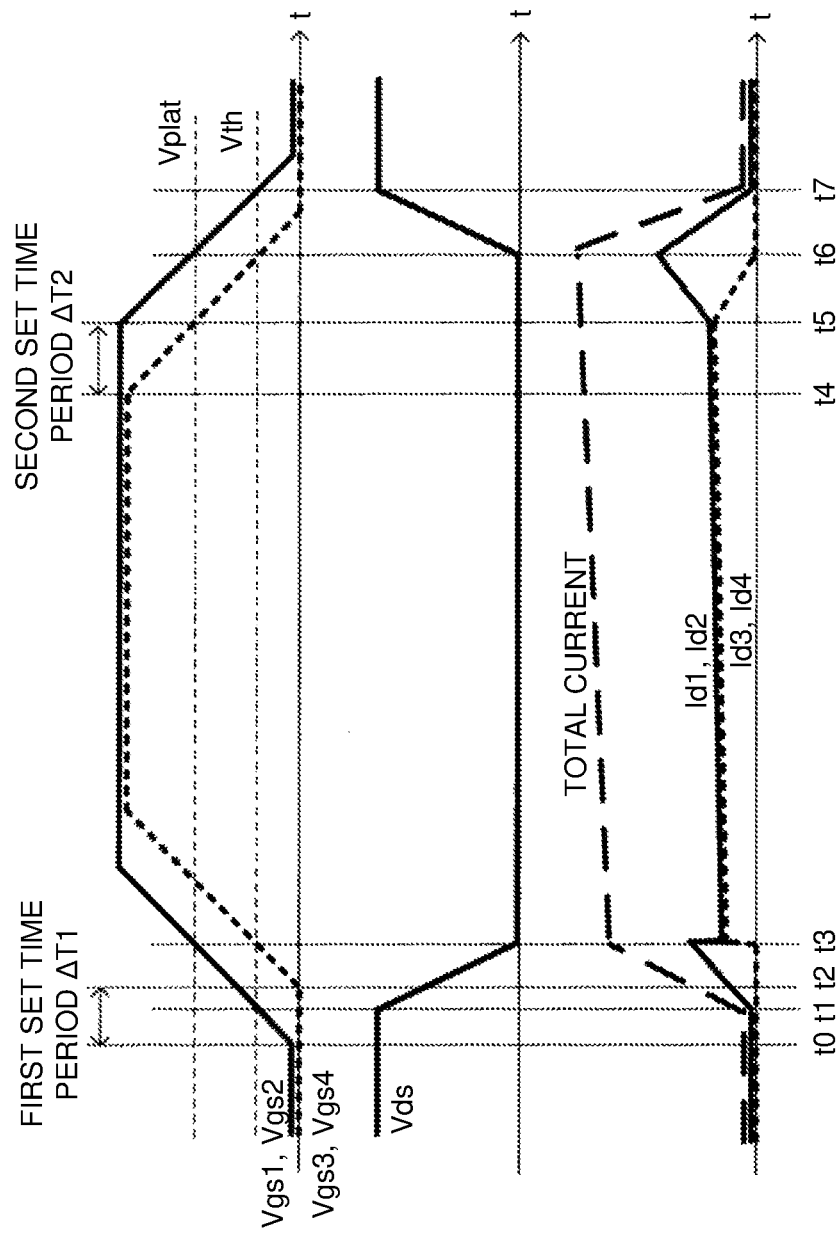
FIG. 15 is a chart for illustrating a second example of the operation waveforms of the first to fourth switching elements in the power conversion device of FIG. 13.

FIG. 15 is an example of a case in which two switching elements 101 and 102 are selected as the first target switching element and the second target switching element from the four switching elements 101 to 104 connected in parallel to each other.

In FIG. 15, operations of the four switching elements 101 to 104 can be controlled by two gate signals. Normally, a driver integrated circuit (IC) for controlling the switching operation of the switching element has one output or two outputs. Accordingly, when the number of gate signals required for control of the switching element is reduced, the number of driver ICs can be reduced. As a result, the power conversion device can be downsized and reduced in cost.

Figure 16:
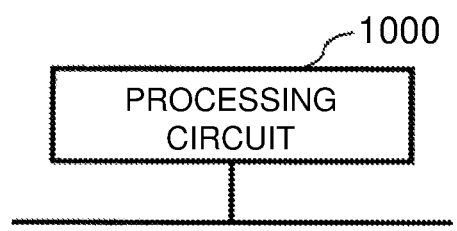
FIG. 16 is a configuration diagram for illustrating a case in which each function of the power conversion device according to each of the first embodiment to the sixth embodiment is implemented by a processing circuit being dedicated hardware.
Figure 17:
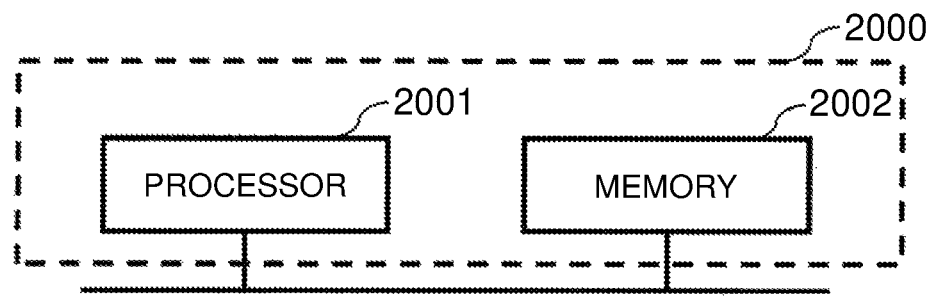
FIG. 17 is a configuration diagram for illustrating a case in which each function of the power conversion device according to each of the first embodiment to the sixth embodiment is implemented by a processing circuit including a processor and a memory.

Each of the functions of the power conversion device according to the first to sixth embodiments described above is implemented by a processing circuit. The processing circuit for implementing each of the functions may be dedicated hardware, or a processor configured to execute a program stored in a memory. FIG. 16 is a configuration diagram for illustrating a case in which functions of the power conversion device according to the first to sixth embodiments are implemented by a processing circuit 4000 being dedicated hardware. Further, FIG. 17 is a configuration diagram for illustrating a case in which the functions of the power conversion device according to the first to sixth embodiments are implemented by a processing circuit 5000 including a processor 5001 and a memory 5002.

When the processing circuit is dedicated hardware, the processing circuit 4000 corresponds to, for example, a single circuit, a composite circuit, a programmed processor, a parallel-programmed processor, an application specific integrated circuit (ASIC), a field programmable gate array (FPGA), or a combination thereof. The functions of the respective units of the power conversion device may each be implemented by the individual processing circuit 4000, or may be implemented together by one processing circuit 4000.

Meanwhile, when the processing circuit is the processor 5001, the functions of the respective units of the power conversion device are implemented by software, firmware, or a combination of software and firmware. The software and the firmware are coded as a program and stored in the memory 5002. The processor 5001 reads out and executes the program stored in the memory 5002, to thereby implement the function of each of the units. That is, the power conversion device each include the memory 5002 configured to store programs the execution of which by the processing circuit 5000 ultimately leads to the implementation of each of the above-mentioned control procedures.

It is also understood that those programs cause a computer to execute the steps and methods described above for the respective units. In this case, the memory 5002 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 2002 also corresponds to, for example, a magnetic disk, a flexible disk, an optical disc, a compact disc, a MiniDisk, or a DVD.

Some of the functions of the respective units described above may be implemented by dedicated hardware, and others thereof may be implemented by software or firmware.

In this manner, the processing circuit can implement the functions of the respective units described above by hardware, software, firmware, or a combination thereof.

REFERENCE SIGNS LIST 100, 200, 300, 400, 500, 600 power conversion device, 101 first switching element (switching element), 102 second switching element (switching element), 103 third switching element (switching element), 104 fourth switching element (switching element), 110, 210, 310, 410, 510, 610 switching circuit, 120, 220, 320, 420, 520, 620 control unit, 301 first temperature detector (temperature detector), 302 second temperature detector (temperature detector), 401 first current detector (current detector), 402 second current detector (current detector), 403 voltage detector

The invention claimed is:

1. A power conversion device, comprising:
a switching circuit including M switching elements connected in parallel to each other, where M is an integer of 2 or more; and
a processing circuitry to control the switching circuit by controlling each of switching operations of the M switching elements,
wherein the processing circuitry is configured to:
  select, in each first set cycle corresponding to an integer multiple of a switching cycle of the switching circuit, where the integer is 1 or more, a first target switching element and a second target switching element from the M switching elements, the number of first target switching elements being 1 or more and less than M, the number of second target switching elements being 1 or more and less than M;
  perform control so that, at a time of a turn-on operation of the switching circuit, a turn-on start time of the first target switching element is earlier by a first set time period than a turn-on start time of another switching element that is not the first target switching element, the first set time period being set so as to be equal to or longer than a turn-on time period in a turn-on operation of the first target switching element; and
  perform control so that, at a time of a turn-off operation of the switching circuit, a turn-off start time of the second target switching element is later by a second set time period than a turn-off start time of another switching element that is not the second target switching element, the second set time period being set so as to be equal to or longer than a turn-off time period in a turn-off operation of the another switching element that is not the second target switching element, and
wherein the processing circuitry is further configured to determine, based on a parasitic inductance of a current path of each of the M switching elements, the number of times that each of the M switching elements is selected as the first target switching element in a second set cycle corresponding to an integer multiple of the first set cycle, where the integer is 2 or more, and the number of times that each of the M switching elements is selected as the second target switching element in the second set cycle.

2. The power conversion device according to claim 1, wherein, in a second set cycle corresponding to an integer multiple of the first set cycle, where the integer is 2 or more, each of the M switching elements is selected as the first target switching element an equal number of times, and each of the M switching elements is also selected as the second target switching element an equal number of times.

3. The power conversion device according to claim 2, wherein the another switching element is the first target switching element, and the first switching element is turned on from the turn-on start time of the first target switching element until the turn-off start time of the first target switching element,
wherein M is three or more, the plurality of switching elements comprises a first switching element, a second switching element and a third switching element, a first switching loss of the power conversion device is reduced to approximately one third of a second switching loss, wherein the second switching loss corresponds to switching all switching elements of the plurality of switching elements at a same time.

4. A power conversion device, comprising:
a switching circuit including M switching elements connected in parallel to each other, where M is an integer of 2 or more;
a temperature detector configured to detect each of temperatures of the M switching elements or each of temperatures around the M switching elements; and
a processing circuitry to control the switching circuit by controlling each of switching operations of the M switching elements,
wherein the processing circuitry is configured to:
select, in each first set cycle corresponding to an integer multiple of a switching cycle of the switching circuit, where the integer is 1 or more, a first target switching element and a second target switching element from the M switching elements, the number of first target switching elements being 1 or more and less than M, the number of second target switching elements being 1 or more and less than M;
perform control so that, at a time of a turn-on operation of the switching circuit, a turn-on start time of the first target switching element is earlier by a first set time period than a turn-on start time of another switching element that is not the first target switching element, the first set time period being set so as to be equal to or longer than a turn-on time period in a turn-on operation of the first target switching element; and
perform control so that, at a time of a turn-off operation of the switching circuit, a turn-off start time of the second target switching element is later by a second set time period than a turn-off start time of another switching element that is not the second target switching element, the second set time period being set so as to be equal to or longer than a turn-off time period in a turn-off operation of the another switching element that is not the second target switching element,
wherein the processing circuitry is further configured to determine, based on each of the temperatures detected by the temperature detector, the number of times that each of the M switching elements is selected as the first target switching element in a second set cycle corresponding to an integer multiple of the first set cycle, where the integer is 2 or more, and the number of times that each of the M switching elements is selected as the second target switching element in the second set cycle.

5. The power conversion device according to claim 1, wherein the processing circuitry is configured to control each of the switching operations of the M switching elements by controlling each of gate signals of the M switching elements.

6. A power conversion device, comprising:
a switching circuit including M switching elements connected in parallel to each other, where M is an integer of 2 or more;
a voltage detector configured to detect a drain-source voltage common among the M switching elements; and
a current detector configured to detect each of drain currents of the M switching elements; and
a processing circuitry to control the switching circuit by controlling each of switching operations of the M switching elements,
wherein the processing circuitry is configured to:
select, in each first set cycle corresponding to an integer multiple of a switching cycle of the switching circuit, where the integer is 1 or more, a first target switching element and a second target switching element from the M switching elements, the number of first target switching elements being 1 or more and less than M, the number of second target switching elements being 1 or more and less than M;
perform control so that, at a time of a turn-on operation of the switching circuit, a turn-on start time of the first target switching element is earlier by a first set time period than a turn-on start time of another switching element that is not the first target switching element, the first set time period being set so as to be equal to or longer than a turn-on time period in a turn-on operation of the first target switching element; and
perform control so that, at a time of a turn-off operation of the switching circuit, a turn-off start time of the second target switching element is later by a second set time period than a turn-off start time of another switching element that is not the second target switching element, the second set time period being set so as to be equal to or longer than a turn-off time period in a turn-off operation of the another switching element that is not the second target switching element,
wherein the processing circuitry is further configured to control each of the switching operations of the M switching elements by controlling each of gate signals of the M switching elements,
wherein the processing circuitry is further configured to determine an end time of the first set time period based on a time at which the drain-source voltage detected by the voltage detector falls below a predetermined voltage value, and
wherein the processing circuitry is further configured to determine an end time of the second set time period based on a time at which a drain current of another switching element that is not the second target switching element, which is detected by the current detector, falls below a predetermined current value.

7. The power conversion device according to claim 1, wherein each of the number of first target switching elements and the number of second target switching elements is 1.

8. The power conversion device according to claim 1, wherein the first target switching element and the second target switching element are the same.

9. The power conversion device according to claim 1, wherein each of the M switching elements is a wide bandgap semiconductor.

* * * * *